(12) United States Patent
Jia et al.

(10) Patent No.: US 9,379,147 B2
(45) Date of Patent: Jun. 28, 2016

(54) THIN-FILM TRANSISTOR ARRAY SUBSTRATE AND MANUFACTURING METHOD THEREOF

(75) Inventors: Pei Jia, Shenzhen (CN); Liu-yang Yang, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 912 days.

(21) Appl. No.: 13/502,136

(22) PCT Filed: Feb. 8, 2012

(86) PCT No.: PCT/CN2012/070951
§ 371 (c)(1),
(2), (4) Date: Apr. 15, 2012

(87) PCT Pub. No.: WO2013/116995
PCT Pub. Date: Aug. 15, 2013

(65) Prior Publication Data
US 2015/0243691 A1   Aug. 27, 2015

(30) Foreign Application Priority Data
Feb. 7, 2012   (CN) .......................... 2012 1 0025865

(51) Int. Cl.
*H01L 21/336* (2006.01)
*H01L 27/12* (2006.01)
*G02F 1/1368* (2006.01)
*H01L 21/02* (2006.01)
*H01L 21/285* (2006.01)
*H01L 21/3213* (2006.01)
(Continued)

(52) U.S. Cl.
CPC .......... *H01L 27/1288* (2013.01); *G02F 1/1368* (2013.01); *H01L 21/0262* (2013.01); *H01L 21/02271* (2013.01); *H01L 21/2855* (2013.01); *H01L 21/32134* (2013.01); *H01L 21/32139* (2013.01); *H01L 21/465* (2013.01); *H01L 27/124* (2013.01); *H01L 27/1222* (2013.01); *H01L 29/458* (2013.01); *H01L 29/4908* (2013.01); *H01L 29/66765* (2013.01); *H01L 29/78669* (2013.01); *H01L 29/78678* (2013.01)

(58) Field of Classification Search
CPC ................ G02F 2001/134372; G02F 1/13458; G02F 2001/136236
USPC ................................ 438/155; 216/23; 349/47
See application file for complete search history.

(56) References Cited

U.S. PATENT DOCUMENTS

2002/0176032 A1* 11/2002 Maeda ................ G02F 1/13458
349/43
2006/0146245 A1* 7/2006 Ahn ................... G02F 1/134363
349/139

(Continued)

*Primary Examiner* — Caridad Everhart
(74) *Attorney, Agent, or Firm* — Mark M. Friedman

(57) ABSTRACT

The present invention discloses a thin-film transistor array substrate and a manufacturing method thereof. The method includes steps of using a first multi-tone adjustment mask to form a gate electrode and a common electrode after depositing a first transparent conductive layer and a first metallic layer on a substrate; depositing a gate-insulating layer and a semiconductor layer and then using a first mask to retain a part of the semiconductor layer that is on a top of the gate electrode; depositing a second transparent conductive layer and a second metallic layer, and using a second multi-tone adjustment mask to form a source electrode, a drain electrode and a pixel electrode.

16 Claims, 3 Drawing Sheets

(51) Int. Cl.

| | |
|---|---|
| *H01L 29/45* | (2006.01) |
| *H01L 29/49* | (2006.01) |
| *H01L 29/66* | (2006.01) |
| *H01L 29/786* | (2006.01) |
| *H01L 21/465* | (2006.01) |

(56) References Cited

U.S. PATENT DOCUMENTS

| | | | |
|---|---|---|---|
| 2007/0272926 A1* | 11/2007 | Deng et al. | 257/59 |
| 2008/0237596 A1* | 10/2008 | Kim | G02F 1/13458 257/59 |
| 2009/0079920 A1* | 3/2009 | Aoki | 349/114 |
| 2009/0101908 A1* | 4/2009 | Kwack | 257/59 |
| 2010/0208155 A1* | 8/2010 | Gao | G02F 1/133555 349/43 |
| 2011/0037917 A1* | 2/2011 | Kimura | 349/46 |
| 2012/0007091 A1* | 1/2012 | Lee | G02F 1/136286 257/60 |
| 2012/0184060 A1* | 7/2012 | Song et al. | 438/34 |
| 2015/0115261 A1* | 4/2015 | Kimura | 257/43 |

* cited by examiner

THIN-FILM TRANSISTOR ARRAY SUBSTRATE AND MANUFACTURING METHOD THEREOF

FIELD OF THE INVENTION

The present invention relates to a field of manufacturing a liquid crystal display device, and more particularly to a thin-film transistor array substrate and a manufacturing method thereof.

BACKGROUND OF THE INVENTION

With the popularization of liquid crystal display device, there is a great demand for the display performance of the liquid crystal display device. Since a liquid crystal display device using Fringe Field Switching (FFS) technology features high transmittance and large view angle, it has been widely used in the field of liquid crystal display.

In a manufacturing process of a thin-film transistor array substrate of a liquid crystal display device, a certain number of masks will be used to perform photolithography process. However, a photolithographic mask is quite expensive; using more photolithographic masks will lead to higher cost of the manufacturing process of thin-film transistor array substrate and the increase of process time and complexity.

Similarly, in the conventional technology, a manufacturing process that uses a multi-mask process (such as a four-mask process) to manufacture a thin-film transistor array substrate of an FFS type liquid crystal display device is much more complicated, the difficulty and cost of manufacturing are higher, and thereby increases the production difficulty of liquid crystal display devices.

Hence, it is necessary to provide a thin-film transistor array substrate and a manufacturing method thereof to overcome the problems existing in the conventional technology.

SUMMARY OF THE INVENTION

An object of the present invention is to provide a manufacturing method of a thin-film transistor array substrate to solve the technical problem that a manufacturing process of the conventional technology using a multi-mask process (such as a four-mask process) to manufacture a thin-film transistor array substrate of an FFS type liquid crystal display device is much more complicated, the difficulty and cost of manufacturing are higher, and thereby the production difficulty of liquid crystal display devices is increased.

In order to solve the abovementioned problem, the present invention provides a manufacturing method of a thin-film transistor array substrate, and the method includes steps of:

providing a substrate;

successively depositing a first transparent conductive layer and a first metallic layer on the substrate by sputtering, and using a first multi-tone adjustment mask to pattern the first transparent conductive layer and the first metallic layer to form a gate electrode and a common electrode, wherein the gate electrode includes the first transparent conductive layer and the second metallic layer and the common electrode is formed through the first conductive layer;

continuing to deposit a gate-insulating layer and a semiconductor layer and using a first mask to pattern the semiconductor layer so as to retain a part of the semiconductor layer that is on a top of the gate electrode;

continuing to deposit a second transparent conductive layer and a second metallic layer on the substrate, using a second multi-tone adjustment mask to pattern the second transparent conductive layer and the second metallic layer so as to form a source electrode and a drain electrode, which both include the second transparent conductive layer and the second metallic layer, on the semiconductor layer, and to form a pixel electrode, which is formed through the second transparent conductive layer, on the gate-insulating layer that the common electrode corresponds to; and depositing a planarization layer on the pixel electrode and the source electrode, the drain electrode and the semiconductor layer which constitute a thin-film transistor, wherein the planarization layer is formed by a transparent insulation material.

In the manufacturing method of a thin-film transistor array substrate of the present invention, the first multi-tone adjustment mask and the second multi-tone adjustment mask are gray tone masks, stacked layer masks or half tone masks.

In the manufacturing method of a thin-film transistor array substrate of the present invention, the gate-insulating layer and the semiconductor layer are successively formed through chemical vapor deposition.

In the manufacturing method of a thin-film transistor array substrate of the present invention, the second transparent conductive layer and the second metallic layer are successively formed through sputtering.

In the manufacturing method of a thin-film transistor array substrate of the present invention, the first metallic layer is formed by orderly forming a first aluminum layer and a first molybdenum layer, and the second metallic layer is formed by orderly forming a second molybdenum layer, a second aluminum layer and a third molybdenum layer.

In the manufacturing method of a thin-film transistor array substrate of the present invention, during the process of using the first multi-tone adjustment mask to form the gate electrode and the common electrode, a mixture of nitric acid, phosphoric acid and acetic acid is used to perform wet etching on the first metallic layer, and oxalic acid is used to perform wet etching on the first transparent conductive layer.

In the manufacturing method of a thin-film transistor array substrate of the present invention, during the process of using the second multi-tone adjustment to form the source electrode, the drain electrode and the pixel electrode on the semiconductor layer, a mixture of nitric acid, phosphoric acid and acetic acid is used to perform wet etching on the second metallic layer, and oxalic acid is used to perform wet etching on the second transparent conductive layer.

Another object of the present invention is to provide a manufacturing method of a thin-film transistor array substrate so as to solve the technical problem that a manufacturing process of the conventional technology using a multi-mask process (such as a four-mask process) to manufacture a thin-film transistor array substrate of an FFS type liquid crystal display device is much more complicated, the difficulty and cost of manufacturing are higher, and thereby the production difficulty of liquid crystal display devices is increased.

In order to solve the abovementioned problem, the present invention provides a manufacturing method of a thin-film transistor array substrate, and the method includes steps of:

providing a substrate;

successively depositing a first transparent conductive layer and a first metallic layer on the substrate, and using a first multi-tone adjustment mask to pattern the first transparent conductive layer and the first metallic layer to form a gate electrode and a common electrode, wherein the gate electrode is formed through a combination of the first transparent conductive layer and the second metallic layer and the common electrode is formed through the first conductive layer;

continuing to deposit a gate-insulating layer and a semiconductor layer and using a first mask to pattern the semiconductor layer so as to retain a part of the semiconductor layer that is on a top of the gate electrode; and continuing to deposit a second transparent conductive layer and a second metallic layer on the substrate, using a second multi-tone adjustment mask to pattern the second transparent conductive layer and the second metallic layer so as to form a source electrode and a drain electrode, which both include the second transparent conductive layer and the second metallic layer, on the semiconductor layer, and to form a pixel electrode, which is formed through the second transparent conductive layer, on the gate-insulating layer that the common electrode corresponds to.

In the manufacturing method of a thin-film transistor array substrate of the present invention, after forming the source electrode, the drain electrode and the pixel electrode, the method further comprises a step of:

depositing a planarization layer on the pixel electrode and the source electrode, the drain electrode and the semiconductor layer which constitute a thin-film transistor, wherein the planarization layer is formed by a transparent insulation material.

In the manufacturing method of a thin-film transistor array substrate of the present invention, the first multi-tone adjustment mask and the second multi-tone adjustment mask are gray tone masks, stacked layer masks or half tone masks.

In the manufacturing method of a thin-film transistor array substrate of the present invention, the first transparent conductive layer and the first metallic layer are successively formed through sputtering.

In the manufacturing method of a thin-film transistor array substrate of the present invention, the gate-insulating layer and the semiconductor layer are successively formed through chemical vapor deposition.

In the manufacturing method of a thin-film transistor array substrate of the present invention, the second transparent conductive layer and the second metallic layer are successively formed through sputtering.

In the manufacturing method of a thin-film transistor array substrate of the present invention, the first metallic layer is formed by orderly forming a first aluminum layer and a first molybdenum layer, and the second metallic layer is formed by orderly forming a second molybdenum layer, a second aluminum layer and a third molybdenum layer.

In the manufacturing method of a thin-film transistor array substrate of the present invention, during the process of using the first multi-tone adjustment mask to form the gate electrode and the common electrode, a mixture of nitric acid, phosphoric acid and acetic acid is used to perform wet etching on the first metallic layer, and oxalic acid is used to perform wet etching on the first transparent conductive layer.

In the manufacturing method of a thin-film transistor array substrate of the present invention, during the process of using the second multi-tone adjustment to form the source electrode, the drain electrode and the pixel electrode on the semiconductor layer, a mixture of nitric acid, phosphoric acid and acetic acid is used to perform wet etching on the second metallic layer, and oxalic acid is used to perform wet etching on the second transparent conductive layer.

Still another object of the present invention is to provide a thin-film transistor array substrate so as to solve the technical problem that a manufacturing process of the conventional technology using a multi-mask process (such as a four-mask process) to manufacture a thin-film transistor array substrate of an FFS type liquid crystal display device is much more complicated, the difficulty and cost of manufacturing are higher, and thereby the production difficulty of liquid crystal display devices is increased.

In order to solve the abovementioned problem, the present invention provides a thin-film transistor array substrate, and the thin-film transistor array substrate includes:

a substrate;

multiple thin-film transistors mounted on the substrate, wherein each of the thin-film transistor includes a gate electrode, a gate-insulating layer, a source electrode and a drain electrode, and the gate electrode, the gate-insulating layer, the source electrode and the drain electrode are orderly formed on the substrate; the gate electrode includes a first transparent conductive layer and a first metallic layer, and the source electrode and the drain electrode both include a second transparent conductive layer and a second metallic layer;

a common electrode formed by the first transparent conductive layer on the substrate; and multiple pixel electrodes being formed by the second transparent conductive layer on the gate-insulating layer and being connecting to the drain electrodes of the thin-film transistors.

In the thin-film transistor array substrate, the first metallic layer is formed by orderly forming a first aluminum layer and a first molybdenum layer, and the second metallic layer is formed by orderly forming a second molybdenum layer, a second aluminum layer and a third molybdenum layer.

Comparing with the conventional technology, the present invention performs a first multi-tone adjustment masking process after successively depositing a first transparent conductive layer and a first metallic layer on a substrate, and then performs a second multi-tone adjustment masking process after continuing depositing a second transparent conductive layer and a second metallic layer so as to form a thin-film transistor array substrate. Apparently, the present invention only uses a three-mask process to manufacture a thin-film transistor array substrate of an FFS type liquid crystal display device, which simplifies the technical manufacturing process, reduces the manufacturing difficulty and cost and enhances the production capacity of liquid crystal display.

In order to make the contents of the present invention to be more easily understood, the preferred embodiments of the present invention are described in detail in cooperation with accompanying drawings as follows:

DETAILED DESCRIPTION OF THE PREFERRED EMBODIMENTS

Figure 1:
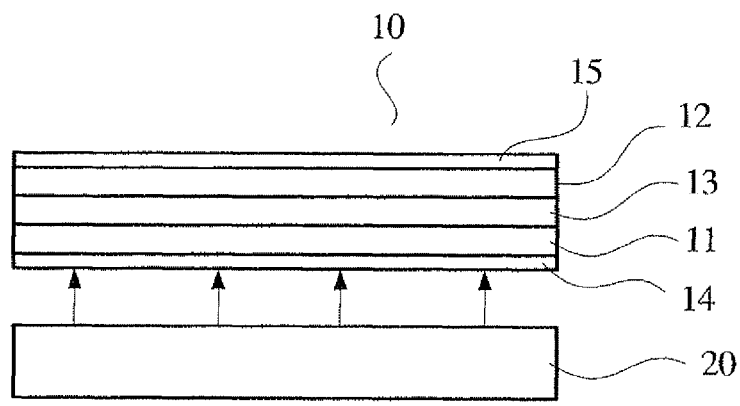
FIG. 1 is a cross sectional view of a display panel and a backlight module according to a preferred embodiment of the present invention.

Following description of each embodiment is referring to the accompanying drawings so as to illustrate practicable specific embodiments in accordance with the present invention. The directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

In the drawings, units with similar structure are labeled with the same reference number.

Please refer to FIG. 1, which is a cross sectional view of a display panel and a backlight module according to a preferred embodiment of the present invention. In the present embodiment, a manufacturing of a thin-film transistor (TFT) array substrate can be applied to a manufacturing process of a display panel 10 (such as a liquid crystal display panel). When using the display panel 10 of the embodiment to manufacture a liquid crystal display device, the display panel 10 can be mounted on a backlight module 20 so as to form the liquid crystal display device. The display panel 10 may comprise a first substrate 11, a second substrate 12, a liquid crystal layer 13, a first polarization plate 14 and a second polarization plate 15. The substrate material of the first substrate 11 and the second substrate 12 may be a glass substrate or a flexible plastic substrate, wherein in this embodiment, the first substrate 11 may be a thin-film transistor array substrate, and the second substrate 12 may be a color filter substrate. It is worth noting that a color filter and a TFT array can be arranged on the same substrate in some embodiments.

With reference to FIG. 1, the liquid crystal layer 13 is formed between the first substrate 11 and the second substrate 12. The first polarization plate 14 is mounted at a side of the first substrate 11 and is opposite to the liquid crystal layer 13 (that is, a light incident side of the first substrate 11); and the second polarization plate 15 is mounted at a side of the second substrate 12 and is opposite to the liquid crystal layer 13 (that is, a light emitting side of the second substrate 12).

FIGS. 2A to 2E a cross sectional views showing a manufacturing process of a thin-film transistor array substrate of a display panel according to a preferred embodiment of the present invention.

Figure 2A:
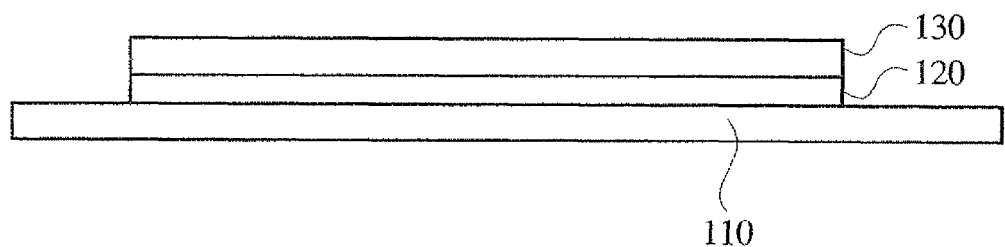
FIGS. 2A to 2E a cross sectional views showing a manufacturing process of a thin-film transistor array substrate of a display panel according to a preferred embodiment of the present invention.

In FIG. 2A, a substrate 110 is provided, and a step of successively depositing a first transparent conductive layer 120 and a first metallic layer 130 on the substrate 110 is implemented.

In the embodiment, the first transparent conductive layer 120 may preferably be formed through a transparent conductive metal; the transparent conductive metal may be such as Indium tin oxide (ITO), Tin oxide (TO), indium zinc oxide (IZO) and Indium tin zinc oxide (ITZO).

Preferably, the first metallic layer 130 is formed by a first aluminum layer and a first molybdenum layer, and other suitable materials are also available, such as silver (Ag), copper (Cu), chromium (Cr), tungsten (W), tantalum (Ta), titanium (Ti), nitrified metal or any combination thereof. It also may be a multi-layer structure having a heat-resistant metallic film and a low electrical resistivity film.

Figure 2B:
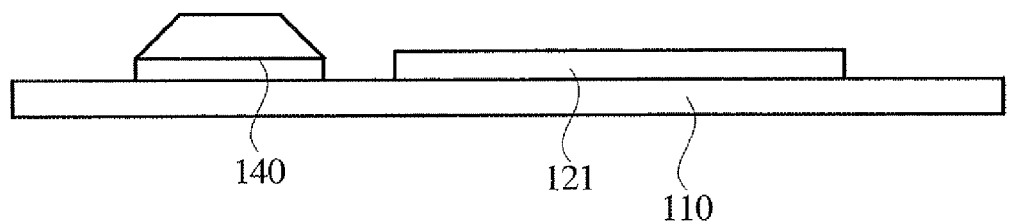

In FIG. 2B, a step of using a first multi-tone adjustment mask to pattern the first transparent conductive layer 120 and the first metallic layer 130 to form a gate electrode 140 and a common electrode 121 is implemented, wherein the gate electrode 140 includes the first transparent conductive layer 120 and the first metallic layer 130, and the common electrode 121 is formed through the transparent conductive layer 120.

In a specific implementation process, the first transparent conductive layer 120 and the first metallic layer 130 are orderly formed on the substrate 110 by sputtering, preferably. Through a photolithography process and an etching process of the first multi-tone adjustment mask, the first transparent conductive layer 120 and the first metallic layer 130 form the gate electrode 140 while the first transparent conductive layer 120 forms the common electrode 121. Other suitable depositing methods, which are not specifically enumerated herein, are also available for forming the first transparent conductive layer 120 and the first metallic layer 130.

During the process of using the first multi-tone adjustment mask to pattern the first transparent conductive layer 120 and the first metallic layer 130 to form the gate electrode 140 and the common electrode 121, a mixture of nitric acid, phosphoric acid and acetic acid is used to perform wet etching on the first metallic layer 130, and oxalic acid may preferably be used to perform wet etching on the first transparent conductive layer 120, and both the layers will shaped as shown in FIG. 2B.

In a specific implementation process, the first multi-tone adjustment mask is preferably a gray tone mask (GTM), a stacked layer mask (SLM) or a half tone mask (HTM). The first multi-tone adjustment mask may include an exposing area, a partial exposing area and an un-exposing area, such that the gate electrode 140 is formed by both the first transparent conductive layer 120 and the first metallic layer 130 while the common electrode 121 is formed by the first transparent conductive layer 120.

Figure 2C:
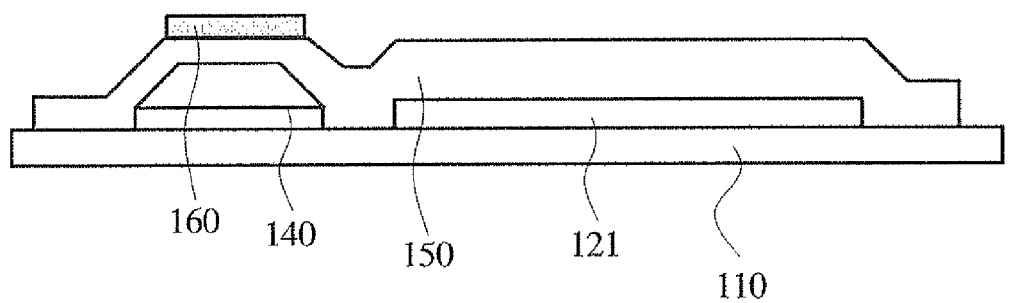

With reference to FIG. 2C, a step of continuing to orderly deposit a gate-insulating layer 150 and a semiconductor layer 160 on the substrate 110 and using a first mask to pattern the semiconductor layer 160 so as to retain a part of the semiconductor layer that is on a top of the gate electrode 140 is implemented and forms a structure as shown in FIG. 2C.

The present invention preferably uses chemical vapor deposition to form the gate-insulating layer 150 and the semiconductor layer 160, the method of chemical vapor deposition may be implemented as plasma enhanced chemical vapor deposition (PECVD). Other suitable methods, which are not specifically enumerated herein, are also available for depositing the gate-insulating layer 150 and the semiconductor layer.

The material of the gate-insulating layer 150 may be silicon nitride (SiNx) or silicon oxide (SiOx). The material of the semiconductor layer 160 may be poly-silicon. In the embodiment, the semiconductor layer 160 may be formed by first depositing an amorphous silicon (a-Si) layer and then performing a rapid thermal annealing (RTA) treatment to the amorphous silicon layer such that the amorphous silicon layer further has a poly-silicon layer crystallized thereon.

Figure 2D:
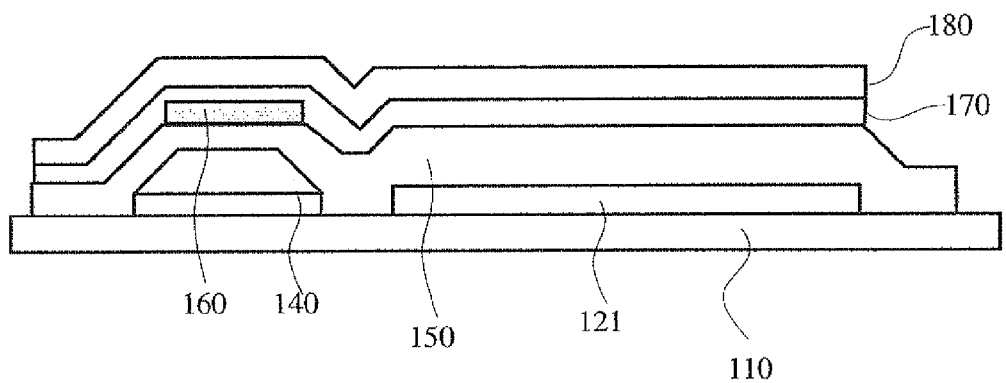

With reference to FIG. 2D, a step of continuing to orderly deposit a second transparent conductive layer 170 and a second metallic layer 180 on the substrate 110 by sputtering is implemented.

The second transparent conductive layer 170 has a thickness that is preferably equal to or less than 100 μm, and may be formed through a transparent conductive metal; and the transparent conductive metal may be such as Indium tin oxide (ITO), Tin oxide (TO), indium zinc oxide (IZO) and Indium tin zinc oxide (ITZO).

Preferably, the second metallic layer 180 is formed by orderly forming a second molybdenum layer, a second aluminum layer and a third molybdenum layer; and other suitable materials are also available, such as silver (Ag), copper (Cu), chromium (Cr), tungsten (W), tantalum (Ta), titanium (Ti), nitrided metal or any combination thereof. It also may be a multi-layer structure having a heat-resistant metallic film and a low electrical resistivity film.

Figure 2E:
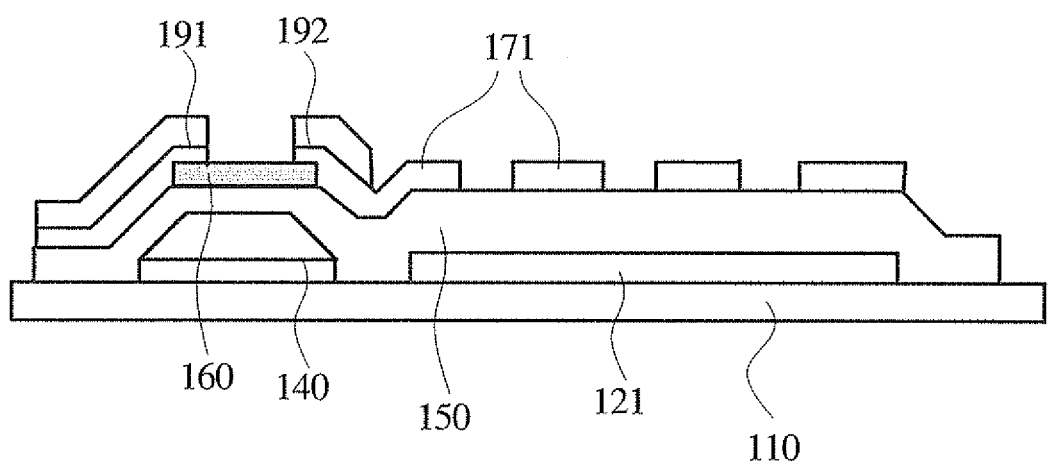

With reference to FIG. 2E, a step of using a second multi-tone adjustment mask to pattern the second transparent conductive layer 170 and the second metallic layer 180 is implemented to form a source electrode 191 and a drain electrode 192, which both include the second transparent conductive layer 170 and the second metallic layer 180, on the semiconductor layer 160, and to form a pixel electrode 171, which is formed through the second transparent conductive layer 170, on the gate-insulating layer 150.

In the specific implementation process, the second multi-tone adjustment mask is preferably a gray tone mask (GTM), a stacked layer mask (SLM) or a half tone mask (HTM) or the like. The second multi-tone adjustment mask may include an exposing area, a partial exposing area and an un-exposing area, such that the source electrode 191 and the drain electrode 192 are formed by both the second transparent conductive layer 170 and the second metallic layer 180 while the pixel electrode 171 is formed by the second transparent conductive layer 170. The pixel electrode 171 is connected to the drain electrode 192, and the common electrode 121 is insulated from the pixel electrode 171 by the gate-insulating layer 150.

During the process of using the second multi-tone adjustment to form the source electrode 191 and the drain electrode 192, which include the second transparent conductive layer 170 and the second metallic layer 180, on the semiconductor layer 160, and to form the pixel electrode 171 including the second transparent conductive layer 170 on the gate-insulating layer 150, a mixture of nitric acid, phosphoric acid and acetic acid is used to perform wet etching on the second metallic layer 180, and oxalic acid is used to perform wet etching on the second transparent conductive layer 170.

In an embodiment, after forming the structure shown in FIG. 2E, a step of depositing a planarization layer on the pixel electrode 171 and the source electrode 191, the drain electrode 192 and the semiconductor layer 160 constituting the thin-film transistor is implemented so as to achieve an effect of planarization and protection. The planarization layer may be formed by a transparent insulation material, and other suitable materials, which are not specifically enumerated herein, are also available.

The present invention further provides a thin-film transistor array substrate, and the thin-film transistor array substrate comprises the substrate 110 and the common electrode 121 and multiple thin-film transistors mounted on the substrate 110.

Each of the thin-film transistors includes the gate electrode 140, the gate-insulating layer 150, the semiconductor layer 160, the source electrode 191 and the drain electrode 192, wherein the gate electrode 140, the gate-insulating layer 150, the semiconductor layer 160, the source electrode 191 and the drain electrode 192 are orderly formed on the substrate 110. The gate electrode 140 includes the first transparent conductive layer 120 and the first metallic layer 130. The source electrode 191 and the drain electrode 192 both include the second transparent conductive layer 170 and the second metallic layer 180.

The common electrode 121 is formed through the first transparent conductive layer 120 on the substrate 110. The thin-film transistor array substrate further includes the pixel electrode 171. The pixel electrode 171 is formed through the second transparent conductive layer 170 which is on a top of the gate-insulating layer 150 that the common electrode 121 corresponds to, and is connected to the drain electrode 192 of the thin-film transistor. The pixel electrode 171 includes a plurality of electrode sections.

Comparing with the conventional technologies that repeat a photolithographic mask process to orderly form a semiconductor layer, a source electrode and a drain electrode that constitute a thin-film transistor, and a pixel electrode to manufacture a thin-film transistor substrate, the thin-film transistor array substrate and the manufacturing method thereof of the present invention first deposits a first transparent conductive layer and a first metallic layer on a substrate, and then uses a multi-tone adjustment mask to form the gate electrode (formed by both the first transparent conductive layer and the first metallic layer) and the common electrode (formed by the first transparent conductive layer), and then deposits a second transparent conductive layer and a second metallic layer after finishing a step of forming the semiconductor layer, and then uses a second multi-tone adjustment mask to form the source electrode and the drain electrode (formed by both the second transparent conductive layer and the second metallic layer) of a thin-film transistor and the pixel electrode (formed by the second transparent conductive layer). Hence, the overall manufacturing process only requires a three-mask process to manufacture a thin-film transistor array substrate of an FFS type liquid crystal display device. Therefore, the number of masks for photolithography process is reduced and thereby manufacturing costs and time can be further reduced.

The present invention has been described with preferred embodiments thereof and it is understood that many changes and modifications to the described embodiments can be carried out without departing from the scope and the spirit of the invention that is intended to be limited only by the appended claims.

The invention claimed is:

1. A manufacturing method of a thin-film transistor array substrate, wherein, the method comprises steps of:
   providing a substrate;
   successively depositing a first transparent conductive layer and a first metallic layer on the substrate by sputtering, and using a first multi-tone adjustment mask to pattern the first transparent conductive layer and the first metallic layer to form a gate electrode and a common electrode, wherein the gate electrode includes the first transparent conductive layer and the second metallic layer and the common electrode is formed through the first transparent conductive layer;
   depositing a gate-insulating layer and a semiconductor layer and using a first mask to pattern the semiconductor layer to retain a part of the semiconductor layer that is on a top of the gate electrode;
   depositing a second transparent conductive layer and a second metallic layer on the substrate, using a second multi-tone adjustment mask to pattern the second transparent conductive layer and the second metallic layer so as to form a source electrode and a drain electrode, which both include the second transparent conductive layer and the second metallic layer, on the semiconductor layer, and to form a pixel electrode, which is formed through the second transparent conductive layer, on the gate-insulating layer that the common electrode corresponds to, wherein a mixture of nitric acid, phosphoric acid and acetic acid is used to perform wet etching on the second metallic layer, and oxalic acid is used to perform wet etching on the second transparent conductive layer, wherein the second transparent conductive layer is indium tin oxide; and
   depositing a planarization layer on the pixel electrode and the source electrode, the drain electrode and the semiconductor layer which constitute a thin-film transistor, wherein the planarization layer is formed by a transparent insulation material.

2. The manufacturing method of a thin-film transistor array substrate according to claim 1, wherein, the first multi-tone adjustment mask and the second multi-tone adjustment mask are gray tone masks, stacked layer masks or half tone masks.

3. The manufacturing method of a thin-film transistor array substrate according to claim 1, wherein, the gate-insulating layer and the semiconductor layer are successively formed through chemical vapor deposition.

4. The manufacturing method of a thin-film transistor array substrate according to claim 1, wherein, the second transparent conductive layer and the second metallic layer are successively formed through sputtering.

5. The manufacturing method of a thin-film transistor array substrate according to claim 1, wherein, the first metallic layer is formed by orderly forming a first aluminum layer and a first molybdenum layer, and the second metallic layer is formed by orderly forming a second molybdenum layer, a second aluminum layer and a third molybdenum layer.

6. The manufacturing method of a thin-film transistor array substrate according to claim 1, wherein, during the process of using the first multi-tone adjustment mask to form the gate electrode and the common electrode, a mixture of nitric acid, phosphoric acid and arctic acid is used to perform wet etching on the first metallic layer, and oxalic acid is used to perform wet etching on the first transparent conductive layer.

7. A manufacturing method of a thin-film transistor array substrate, wherein, the method comprises steps of:
  providing a substrate;
  successively depositing a first transparent conductive layer and a first metallic layer on the substrate, and using, a first multi-tone adjustment mask to pattern the first transparent conductive layer and the first metallic layer to form a gate electrode and a common electrode, wherein the gate electrode includes the first transparent conductive layer and the second metallic layer and the common electrode is formed through the first transparent conductive layer;
  depositing a gate-insulating layer and a semiconductor layer and using a first mask to pattern the semiconductor layer so as to retain a part of the semiconductor layer that is on a top of the gate electrode; and
  depositing a second transparent conductive layer and a second metallic layer on the substrate, using a second multi-tone adjustment mask to pattern the second transparent conductive layer and the second metallic layer so as to form a source electrode and a drain electrode, which both include the second transparent conductive layer and the second metallic layer, on the semiconductor layer, and to form a pixel electrode, which is formed through the second transparent conductive layer, on the gate-insulating layer that the common electrode corresponds to wherein a mixture of nitric acid, phosphoric acid and acetic acid is used to perform wet etching on the second metallic layer, and oxalic acid is used to perform wet etching on the second transparent conductive layer, wherein the second transparent conductive layer is indium tin oxide.

8. The manufacturing method of a thin-film transistor array substrate according to claim 7, wherein, after forming the source electrode, the drain electrode and the pixel electrode, the method further comprises a step of:
  depositing a planarization layer on the pixel electrode and the source electrode, the drain electrode and the semiconductor layer which constitute a thin-film transistor, wherein the planarization layer is formed by a transparent insulation material.

9. The manufacturing method of a thin-film transistor array substrate according to claim 7, wherein, the first multi-tone adjustment mask and the second multi-tone adjustment mask are gray tone masks, stacked layer masks or half tone masks.

10. The manufacturing method of a thin-film transistor array substrate according to claim 7, wherein, the first transparent conductive layer and the first metallic layer are successively formed through sputtering.

11. The manufacturing method of a thin-film transistor array substrate according to claim 7, wherein, the gate-insulating layer and the semiconductor layer are successively formed through chemical vapor deposition.

12. The manufacturing method of a thin-film transistor array substrate according to claim 7, wherein,
  the second transparent conductive layer and the second metallic layer are successively formed through sputtering.

13. The manufacturing method of a thin-film transistor array substrate according to claim 7, wherein, the first metallic layer is formed by orderly forming a first aluminum layer and a first molybdenum layer, and the second metallic layer is formed by orderly forming a second molybdenum layer, a second aluminum layer and a third molybdenum layer.

14. The manufacturing method of a thin-film transistor array substrate according to claim 7, wherein, during the process of using the first multi-tone adjustment mask to form the gate electrode and the common electrode, a mixture of nitric acid, phosphoric acid and acetic acid is used to perform wet etching on the first metallic layer, and oxalic acid is used to perform wet etching on the first transparent conductive layer.

15. A thin-film transistor array substrate, wherein, the thin-film transistor array substrate comprises:
  a substrate;
  multiple thin-film transistors mounted on the substrate, wherein each of the thin-film transistor includes a gate electrode, a gate-insulating layer, a source electrode and a drain electrode, and the gate electrode, the gate-insulating layer, the source electrode and the drain electrode are orderly formed on the substrate; the gate electrode includes a first transparent conductive layer and a first metallic layer, and the source electrode and the drain electrode both include a second transparent conductive layer and a second metallic layer, wherein the second metallic layer is formed on the second transparent conductive layer, wherein the second transparent conductive layer is indium tin oxide;
  a common electrode formed by the first transparent conductive layer on the substrate; and
  multiple pixel, electrodes being formed by the second transparent conductive layer on the gate-insulating layer and being connecting to the drain electrodes of the thin-film transistors.

16. The thin-film transistor array substrate according to claim 15, wherein, the first metallic layer is formed by orderly forming a first aluminum layer and a first molybdenum layer, and the second metallic layer is formed by orderly forming a second molybdenum layer, a second aluminum layer and a third molybdenum layer.

* * * * *